(12) United States Patent
Umemoto et al.

(10) Patent No.: US 7,906,430 B2
(45) Date of Patent: Mar. 15, 2011

(54) METHOD OF MANUFACTURING A SEMICONDUCTOR DEVICE WITH A PEELING PREVENTION LAYER

(75) Inventors: Mitsuo Umemoto, Ora-Gun (JP); Kojiro Kameyama, Ota (JP); Akira Suzuki, Ota (JP)

(73) Assignees: Sanyo Electric Co., Ltd., Osaka (JP); Kanto Sanyo Semiconductors Co., Ltd., Gunma ( * ) Notice: Subject to any disclaimer, the term of this patent is extended or adjusted under 35 U.S.C. 154(b) by 0 days.

(21) Appl. No.: 12/109,800

(22) Filed: Apr. 25, 2008

(65) Prior Publication Data

US 2008/0254618 A1    Oct. 16, 2008

Related U.S. Application Data

(62) Division of application No. 11/236,881, filed on Sep. 28, 2005, now Pat. No. 7,382,037.

(30) Foreign Application Priority Data

Sep. 29, 2004  (JP) ................................. 2004-284794

(51) Int. Cl.
*H01L 21/44*    (2006.01)

(52) U.S. Cl. ......... 438/667; 438/625; 438/626; 438/627; 438/628; 438/629; 438/637; 438/687; 438/691; 257/203; 257/620; 257/750; 257/752; 257/773; 257/774; 257/777; 257/797; 257/E23.011; 257/E21.495; 205/123; 205/137; 29/846; 29/847; 29/852

(58) Field of Classification Search .................. 438/252, 438/625–629, 637, 638, 667, 687, 691; 257/620, 257/203, 750, 752, 773, 774, 777, 797, E23.011, E21.495; 205/123, 137; 427/97.1–98.1; 29/846, 847, 852

See application file for complete search history.

(56) References Cited

U.S. PATENT DOCUMENTS 5,229,647 A    7/1993 Gnadinger
(Continued)

FOREIGN PATENT DOCUMENTS

EP    1408547 A2 *    4/2004
(Continued)

OTHER PUBLICATIONS

Umemoto et al., U.S. Office Action, mailed May 15, 2007, directed to U.S. Appl. No. 11/236,881; 11 pages.

(Continued)

*Primary Examiner* — Fernando L Toledo
*Assistant Examiner* — John P Dulka
(74) *Attorney, Agent, or Firm* — Morrison & Foerster LLP

(57) ABSTRACT

A peeling prevention layer for preventing an insulation film and a protection layer from peeling is formed in corner portions of a semiconductor device. The peeling prevention layer can increase its peeling prevention effect more when formed in a vacant space of the semiconductor device other than the corner portions, for example, between ball-shaped conductive terminals. In a cross section of the semiconductor device, the peeling prevention layer is formed on the insulation film on the back surface of the semiconductor substrate, and the protection layer formed of a solder resist or the like is formed covering the insulation film and the peeling prevention layer. The peeling prevention layer has a lamination structure of a barrier seed layer and a copper layer formed thereon when formed by an electrolytic plating method.

6 Claims, 17 Drawing Sheets

U.S. PATENT DOCUMENTS

| | | |
|---|---|---|
| 5,399,898 A | 3/1995 | Rostoker |
| 5,424,245 A | 6/1995 | Gurtler et al. |
| 5,432,999 A | 7/1995 | Capps et al. |
| 5,561,082 A | 10/1996 | Matsuo et al. |
| 5,814,889 A | 9/1998 | Gaul |
| 6,168,969 B1 | 1/2001 | Farnworth |
| 6,570,243 B1 | 5/2003 | Hagihara |
| 6,710,446 B2 | 3/2004 | Nagai et al. |
| 6,809,421 B1 | 10/2004 | Hayasaka et al. |
| 6,998,344 B2 | 2/2006 | Akram et al. |
| 7,102,219 B2 | 9/2006 | Hanaoka et al. |
| 7,112,863 B2 | 9/2006 | Imaoka |
| 7,112,887 B2 | 9/2006 | Swan et al. |
| 7,122,457 B2 | 10/2006 | Tanida et al. |
| 7,122,912 B2 | 10/2006 | Matsui |
| 7,193,239 B2 | 3/2007 | Leedy |
| 2002/0130412 A1* | 9/2002 | Nagai et al. .................. 257/737 |
| 2002/0170173 A1* | 11/2002 | Mashino ......................... 29/852 |
| 2004/0063268 A1* | 4/2004 | Noma et al. ................. 438/202 |
| 2004/0147128 A1* | 7/2004 | Yui et al. ....................... 438/691 |

FOREIGN PATENT DOCUMENTS

JP  2003-309221  10/2003

OTHER PUBLICATIONS

Umemoto et al., U.S. Office Action, mailed Oct. 3, 2007, directed to U.S. Appl. No. 11/236,881; 9 pages.

* cited by examiner

METHOD OF MANUFACTURING A SEMICONDUCTOR DEVICE WITH A PEELING PREVENTION LAYER

CROSS-REFERENCE OF THE INVENTION

This application is a division of U.S. Ser. No. 11/236,881, filed Sep. 28, 2005, now U.S. Pat. No. 7,382,037.

This application claims priority from Japanese Patent Application No. 2004-284794, the content of which is incorporated herein by reference in its entirety.

BACKGROUND OF THE INVENTION

1. Field of the Invention

The invention relates to a semiconductor device and a manufacturing method thereof, particularly, a semiconductor device having penetrating electrodes and a manufacturing method thereof.

2. Description of the Related Art

CSP (Chip Size Package) has received attention in recent years as a new packaging technology. The CSP means a small package having almost the same outside dimensions as those of a semiconductor die packaged in it.

Conventionally, BGA (ball grip array) type semiconductor devices having penetrating electrodes have been known as a kind of CSP. This BGA type semiconductor device has penetrating electrodes penetrating a semiconductor substrate and connected with pad electrodes formed on a front surface of the substrate. In this semiconductor device, a plurality of ball-shaped conductive terminals made of metal such as solder is arrayed in a grid pattern on a back surface, and electrically connected with the penetrating electrodes through wiring layers. When this semiconductor device is mounted on electronic equipment, the conductive terminals are connected to a circuit board, for example, wiring patterns on a printed circuit board.

Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides.

FIG. 19 is a cross-sectional view of a penetrating electrode portion of the BGA type semiconductor device having the penetrating electrodes. A pad electrode 11 is formed on a front surface of a semiconductor substrate 10 formed of silicon (Si) and the like with an interlayer insulation film 12 therebetween. Furthermore, a support body 13 such as a glass substrate is attached to the front surface of the semiconductor substrate 10 with a resin layer 14 therebetween. Furthermore, a via hole 16 penetrating the semiconductor substrate 10 to the pad electrode 11 is formed. An insulation film 17 formed of a silicon oxide film ($SiO_2$ film) or a silicon nitride film (SiN film) is formed on a sidewall of the via hole 16 and on a back surface of the semiconductor substrate 10.

Furthermore, a barrier seed layer 20 connected with the pad electrode 11 and a penetrating electrode 21 are formed in the via hole 16. A wiring layer 22 connected with the penetrating electrode 21 extends over the back surface of the semiconductor substrate 10. Furthermore, a protection layer 23 formed of a solder resist is formed covering the penetrating electrode 21, the wiring layer 22 and the insulation film 17 on the back surface of the semiconductor substrate 10. An opening is formed in the protection layer 23 on the wiring layer 22, and a ball-shaped conductive terminal 24 connected with the wiring layer 22 through this opening is formed. The relevant technology is disclosed in the Japanese Patent Application Publication No. 2003-309221.

However, in the described BGA type semiconductor device, when a thermal cycle test is performed as one of endurance tests, mainly, the protection film 23 peels in four corner portions of the semiconductor device, i.e., corner portions of the semiconductor substrate 10 after dicing, or both the protection film 23 and the insulation film 17 thereunder peel from the semiconductor substrate 10, as shown in FIG. 20, causing a problem of lowering reliability of the semiconductor device. The cause of this problem is presumably that the protection film 23 and the insulation film 17 thereunder peel when applied with thermal stress beyond endurance during the thermal cycle test of the semiconductor device.

SUMMARY OF THE INVENTION

The invention provides a semiconductor device that includes a semiconductor substrate having a via hole connecting a front surface of the semiconductor substrate and a back surface of the semiconductor substrate, a pad electrode disposed on the front surface to cover the via hole, an insulation film covering a sidewall of the via hole and the back surface, a penetrating electrode disposed in the via hole and connected with the pad electrode, a peeling prevention layer disposed on the insulation film so as to be electrically isolated, and a protection layer covering the penetrating electrode, the insulation film and the peeling prevention layer.

The invention also provides another semiconductor device that includes a semiconductor substrate having a via hole connecting a front surface of the semiconductor substrate and a back surface of the semiconductor substrate, a first insulation film disposed on the front surface, a pad electrode disposed on the front surface to cover the via hole and part of the first insulation film, a second insulation film covering a sidewall of the via hole and the back surface, a penetrating electrode disposed in the via hole and connected with the pad electrode, a wiring layer connected with the penetrating electrode and extending over the second insulation film on the back surface, a peeling prevention layer disposed on the insulation film so as to be electrically isolated, a protection layer covering the penetrating electrode, the second insulation film, the wiring layer and the peeling prevention layer, and a conductive terminal disposed on the wiring layer through an opening of the protection layer.

The invention further provides a method of manufacturing a semiconductor device. The method includes providing a semiconductor substrate including a first insulation film formed on a front surface of the semiconductor substrate and a pad electrode formed on the first insulation film, forming from a back surface of the semiconductor substrate a via hole to penetrate the semiconductor substrate in a position of the semiconductor substrate corresponding to the pad electrode, forming a second insulation film to cover a sidewall of the via hole and the back surface, forming a metal layer in the via hole and on the back surface covered by the second insulation film, patterning the metal layer to form a penetrating electrode disposed in the via hole and connected with the pad electrode and a peeling prevention layer disposed on the second insulation film so as to be electrically isolated, and forming a protection layer covering the penetrating electrode, the second insulation film and the peeling prevention layer.

DETAILED DESCRIPTION OF THE INVENTION

Figure 1:
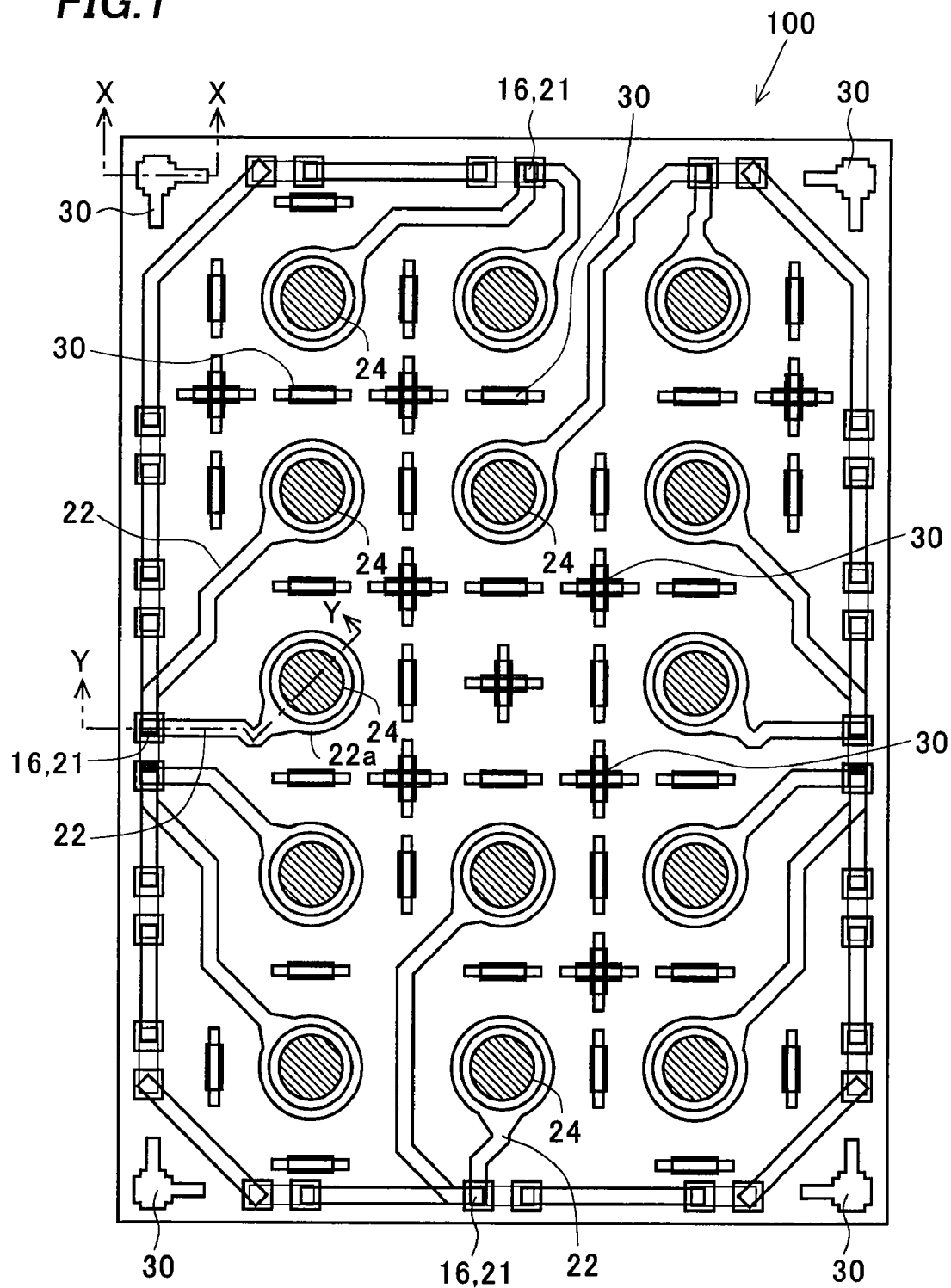
FIG. 1 is a plan view of a semiconductor device of a first embodiment of the invention.
Figure 2:
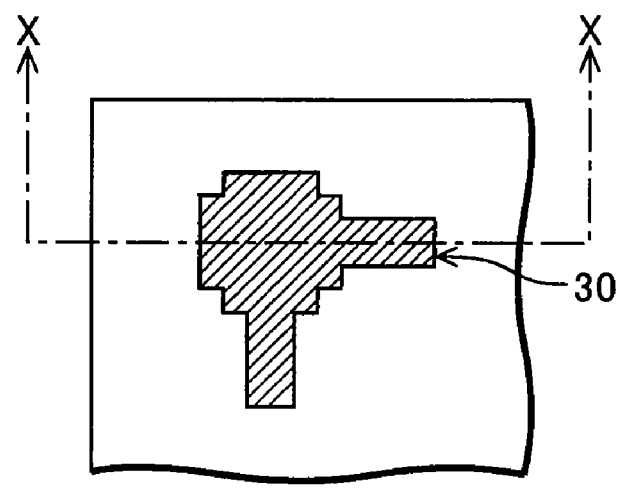
FIG. 2 is an enlarged plan view of a corner portion of the semiconductor device of the first embodiment of the invention.
Figure 3:
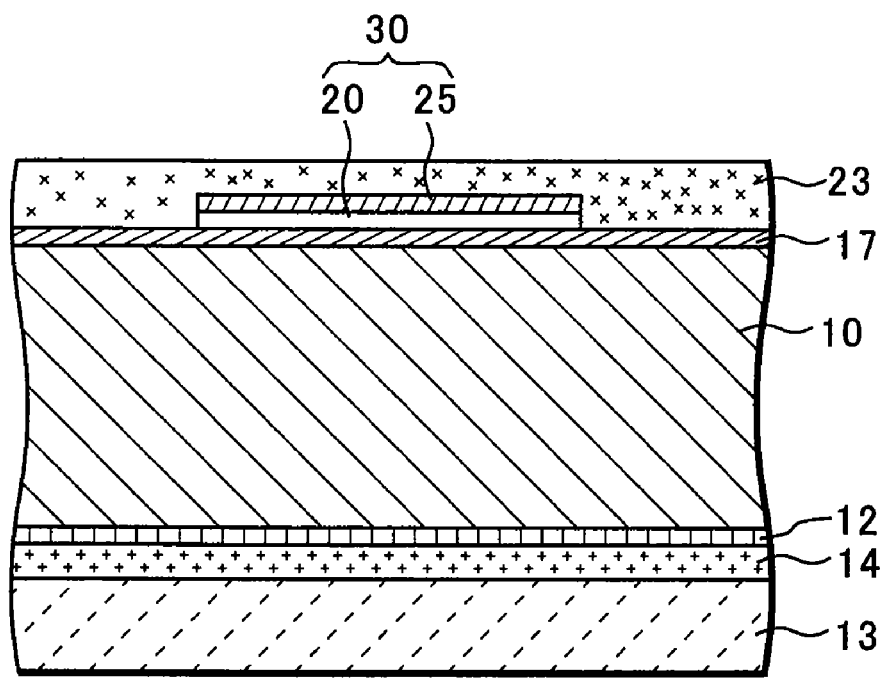
FIG. 3 is a cross-sectional view along line X-X of FIG. 2.
Figure 11A:
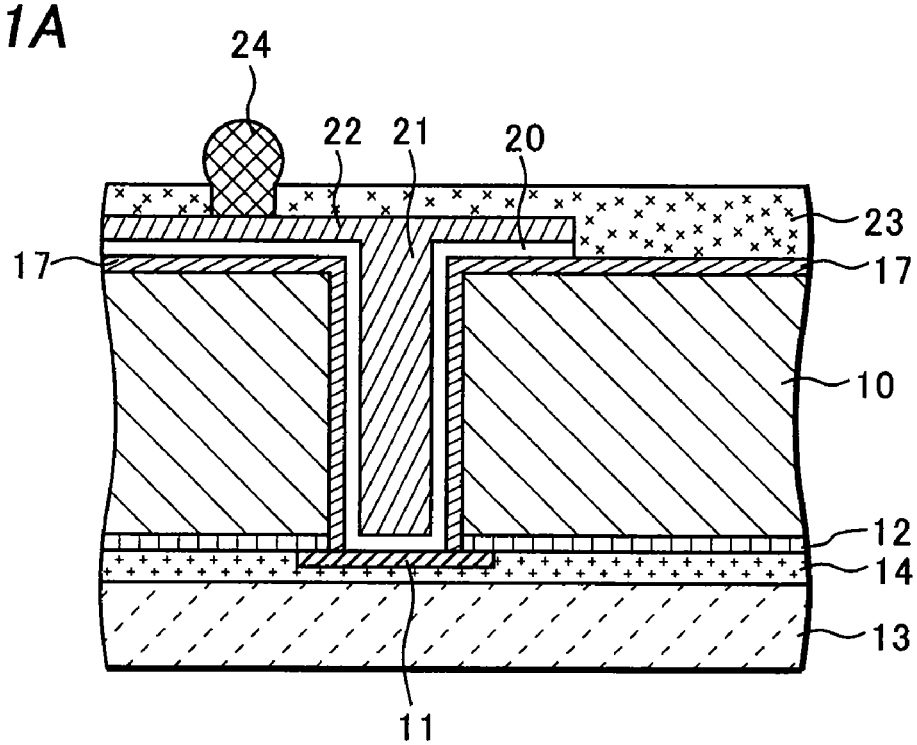

A first embodiment of the invention will be described with reference to drawings. FIG. 1 is a plan view of a semiconductor device 100 showing its back surface, FIG. 2 is an enlarged plan view of its corner portion, and FIG. 3 is a cross-sectional view along line X-X of FIGS. 1 and 2. FIG. 11A is a cross-sectional view along line Y-Y of FIG. 1.

Figure 19:
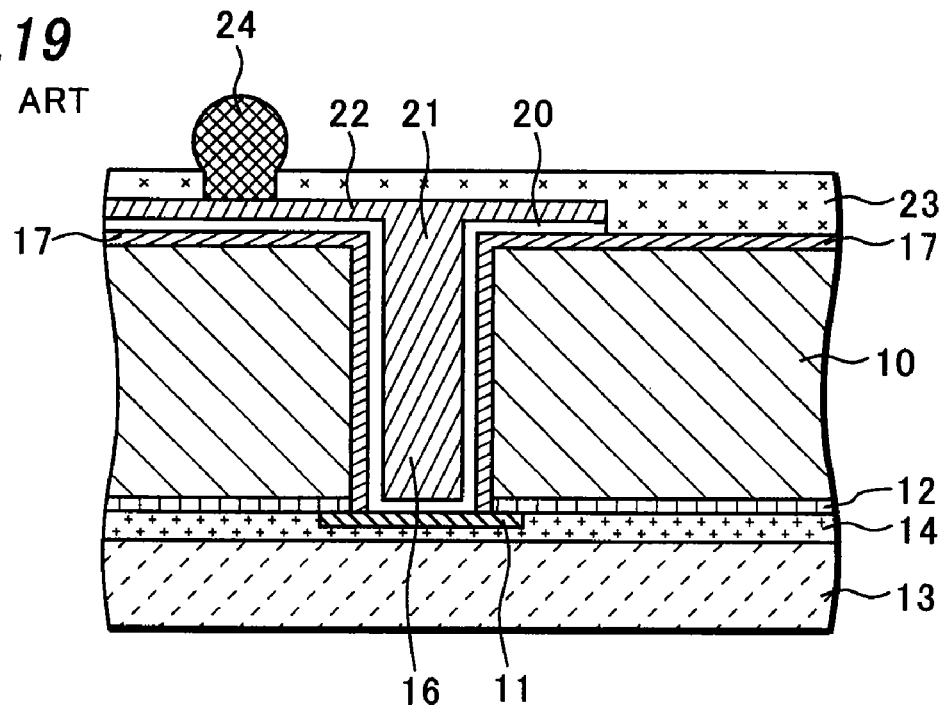
FIG. 19 is a cross-sectional view of a penetrating electrode portion of a semiconductor device of a conventional art.
Figure 20:
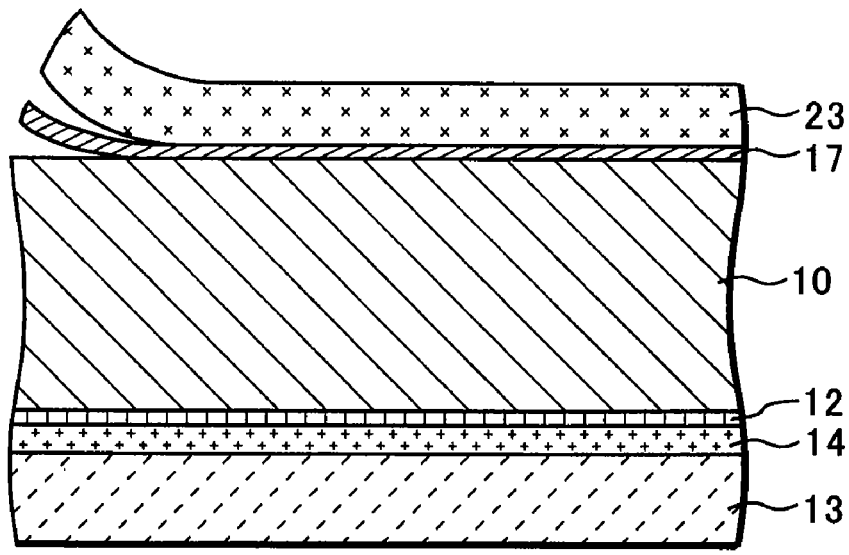
FIG. 20 is a cross-sectional view of a corner portion of the semiconductor device of the conventional art.

On a back surface of this semiconductor device 100, as shown in FIG. 1, a plurality of ball-shaped conductive terminals 24 is arrayed in a matrix, and each of the conductive terminals 24 is connected with a pad electrode 11 on a front surface of the semiconductor device 100 through a penetrating electrode 21 and a wiring layer 22. The cross-sectional view of FIG. 11A is basically the same as FIG. 19 described in the conventional art.

In this embodiment, a peeling prevention layer 30 for preventing an insulation film 17 and a protection layer 23 peeling is formed in each of four corner portions of the semiconductor device 100. In addition, the peeling prevention layers 30 are formed between the ball-shaped conductive terminals 24 to increase the effect of peeling prevention. They may be formed anywhere on the back surface as long as they do not impede other device elements on the back surface. The peeling prevention layer 30 can form any shape of pattern, for example, a cross as shown in FIG. 2 or a rectangle.

In a cross section of the semiconductor device 100, as shown in FIG. 3, the peeling prevention layer 30 is formed on the insulation film 17 on the back surface of the semiconductor substrate 10. The protection layer 23 formed of a solder resist or the like is formed, covering the insulation film 17 and the peeling prevention layer 30. When formed by an electrolytic plating method, the peeling prevention layer 30 has a lamination structure of a barrier seed layer 20 and a copper layer 25 formed thereon, but can be formed of a single metal layer having high adhesiveness to the protection layer 23. Generally, compared with an insulation film such as an oxide film, copper has high adhesiveness to the protection layer 23 formed of a solder resist or the like and a large anchor effect. Therefore, it is preferable that the peeling prevention layer 30 is formed of a copper layer at least.

A manufacturing method of the semiconductor device 100 provided with the described peeling prevention layer 30 will be described with reference to FIGS. 4A to 11B. FIGS. 4A, 5A, 6A, 7A, 8A, 9A, 10A, and 11A are cross-sectional views along line Y-Y of FIG. 1, and FIGS. 4B, 5B, 6B, 7B, 8B, 9B, 10B, and 11B are cross-sectional views along line X-X of FIG. 1.

Figure 4A:
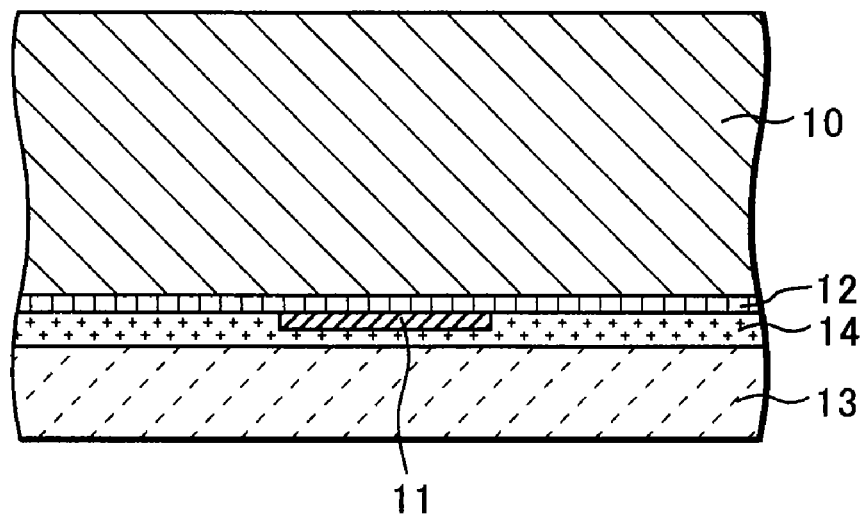
FIGS. 4A to 11B are cross-sectional views showing a semiconductor device manufacturing method of the first embodiment of the invention.
Figure 4B:
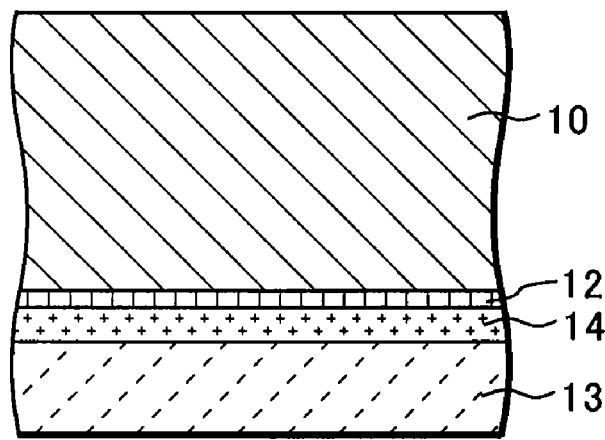

First, as shown in FIGS. 4A and 4B, the semiconductor substrate 10 formed with electronic devices (not shown) on its front surface is prepared. The electronic device is a light receiving element such as CCD (Charge Coupled Device) or an infrared ray sensor, or a light emissive element, for example. Alternatively, the electronic device can be the other electronic device than the light receiving element or the emissive element.

Furthermore, the pad electrode 11 as an external connection electrode connected with the electronic device is formed on the front surface of the semiconductor substrate 10. The pad electrode 11 is formed on the front surface of the semiconductor substrate 10 with an interlayer insulation film 12 as a first insulation film therebetween.

The semiconductor substrate 10 is formed of, for example, silicon (Si), and preferably has thickness of about 20 to 200 μm. The pad electrode 11 is formed of, for example, aluminum (Al), and preferably has thickness of about 1 μm. The interlayer insulation film 12 is formed of, for example, an oxide film, and preferably has thickness of about 0.8 μm.

It is possible to form a support body 13 on the front surface of the semiconductor substrate 10, if such a support body is required. This support body 13 is formed on the front surface of the semiconductor substrate 10 with a resin layer 14 therebetween. When the electronic device is the light receiving element or the light emissive element, the support body 13 is formed of a transparent or semitransparent material such as a glass. When the electronic device is not the light receiving element or the light emissive element, the support body 13 is not necessarily formed of the transparent or semitransparent material. Furthermore, the support body 13 can form a tape-like shape. This support body 13 may be removed in subsequent process steps or may become part of the semiconductor device 100.

Figure 5A:
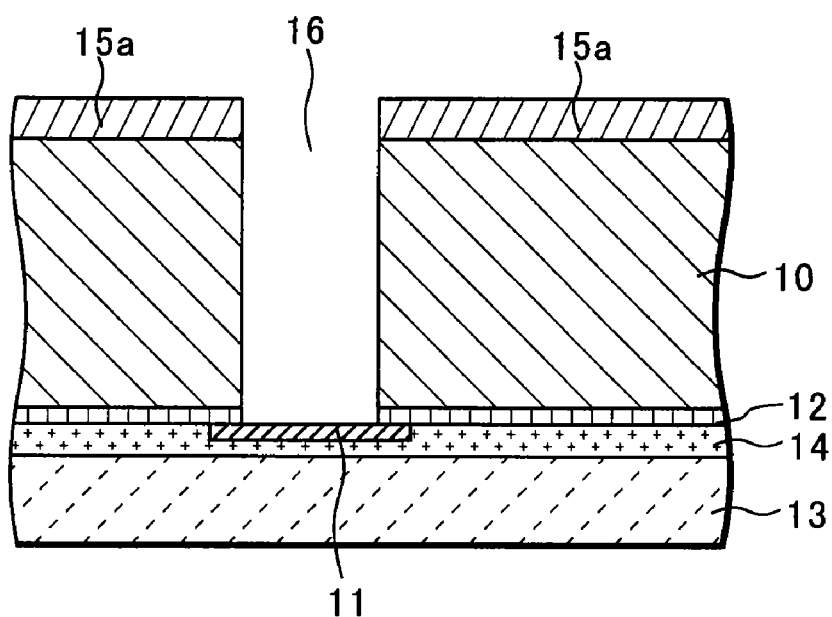
Figure 5B:
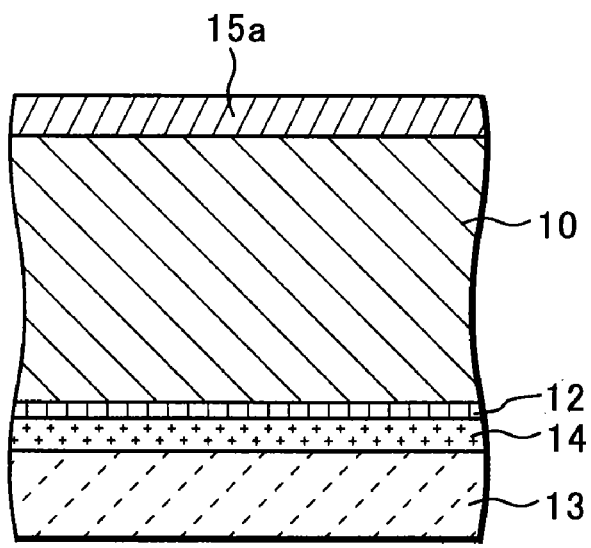

Next, as shown in FIGS. 5A and 5B, a first resist layer 15a is selectively formed on the back surface of the semiconductor substrate 10. That is, the first resist layer 15a has an opening in a position corresponding to the pad electrode 11, on the back surface of the semiconductor substrate 10. Then, the semiconductor substrate 10 is etched, preferably by a dry etching method using this first resist layer 15a as a mask. The etching gas for the dry etching includes $CHF_3$, or the like, which is will known in the art.

By this etching, a via hole 16 is formed, penetrating the semiconductor substrate 10 in a position corresponding to the pad electrode 11 from the back surface to the front surface. The interlayer insulation film 12 is exposed at a bottom of the via hole 16, and the pad electrode 11 is in contact with a lower side of the interlayer insulation film 12. Furthermore, by dry etching or wet etching with the first resist layer 15a as a mask, the interlayer insulation film 12 exposed at the bottom of the via hole 16 is etched to be thinned, or completely removed. Alternatively, the interlayer insulation film 12 is not etched at this process step and instead is etched at an etching process step subsequent to this process step.

Figure 6A:
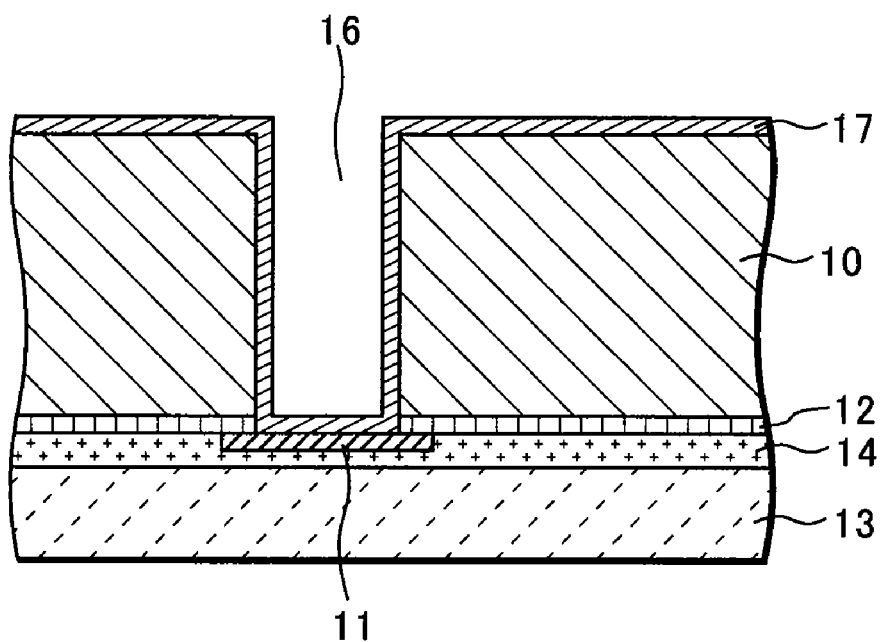
Figure 6B:
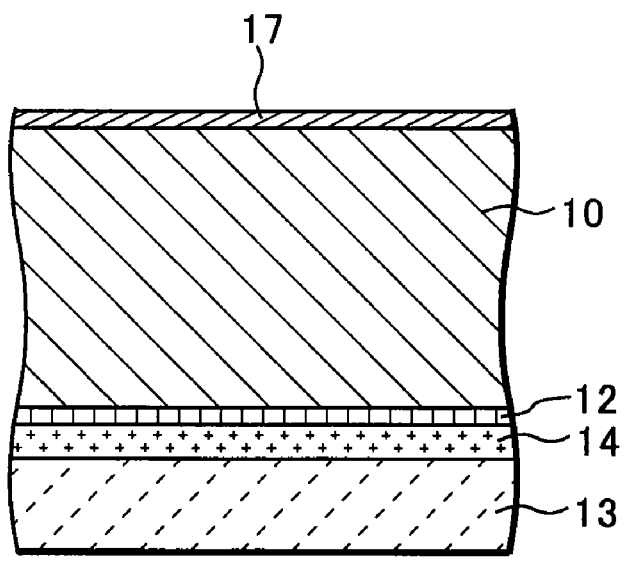

Next, after the first resist layer 15a is removed, as shown in FIGS. 6A and 6B, an insulation film 17 as a second insulation film is formed on the whole back surface of the semiconductor substrate 10 including in the via hole 16. The insulation film 17 is formed of, for example, a silicon oxide film ($SiO_2$ film) or a silicon nitride film (SiN film), by, for example, a plasma CVD method.

Figure 7A:
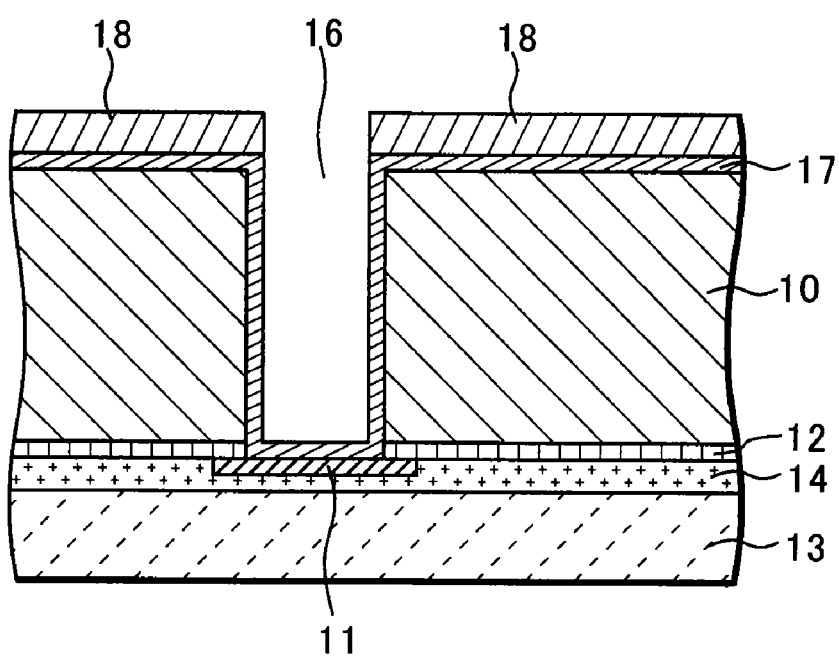
Figure 7B:
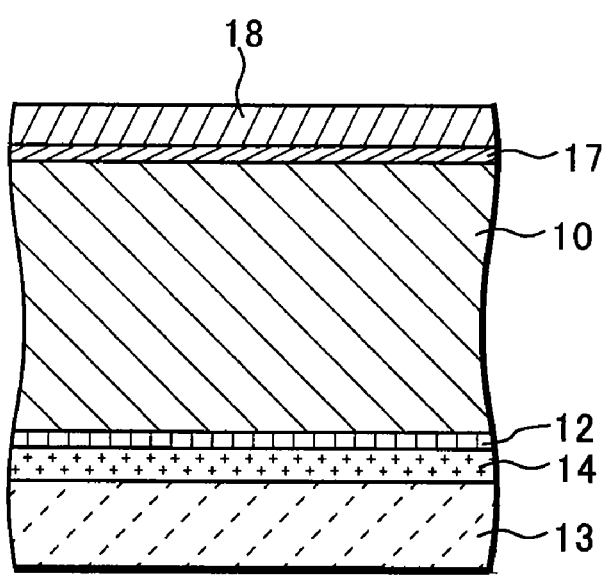
Figure 8A:
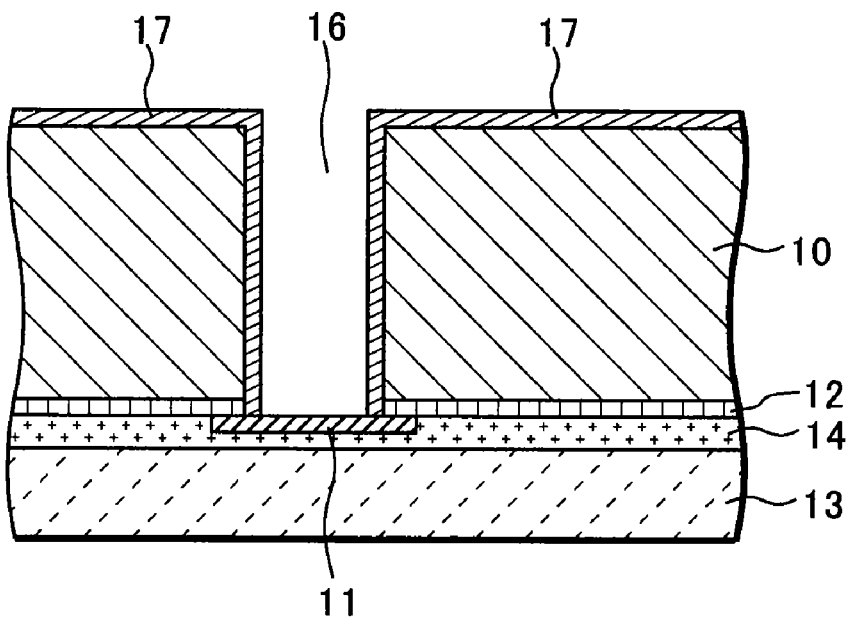
Figure 8B:
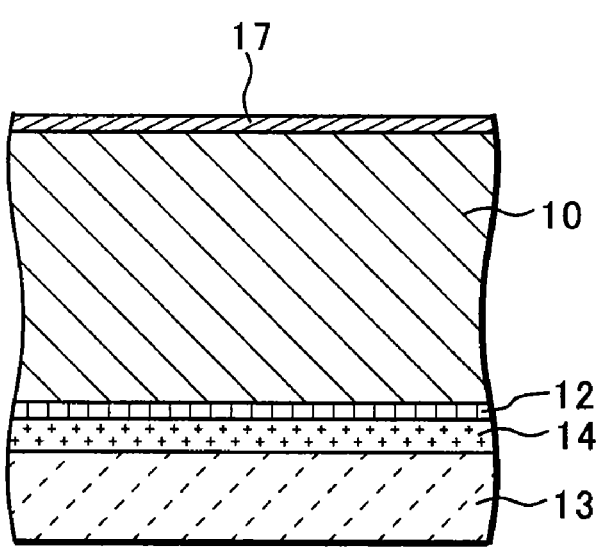

Next, as shown in FIGS. 7A and 7B, a second resist layer 18 is formed on the insulation film 17. Then, as shown in FIGS. 8A and 8B, using the second resist layer 18 as a mask, the insulation film 17 at the bottom of the via hole 16 (including the interlayer insulation film 12 if left) is etched and removed. It is preferable that this etching is reactive ion etching, for example, but can be other etching. By this etching, the insulation film 17 at the bottom is removed to expose the pad electrode 11, leaving the insulation film 17 on the sidewall of the via hole 16. After this etching, the second resist layer 18 is removed.

Figure 9A:
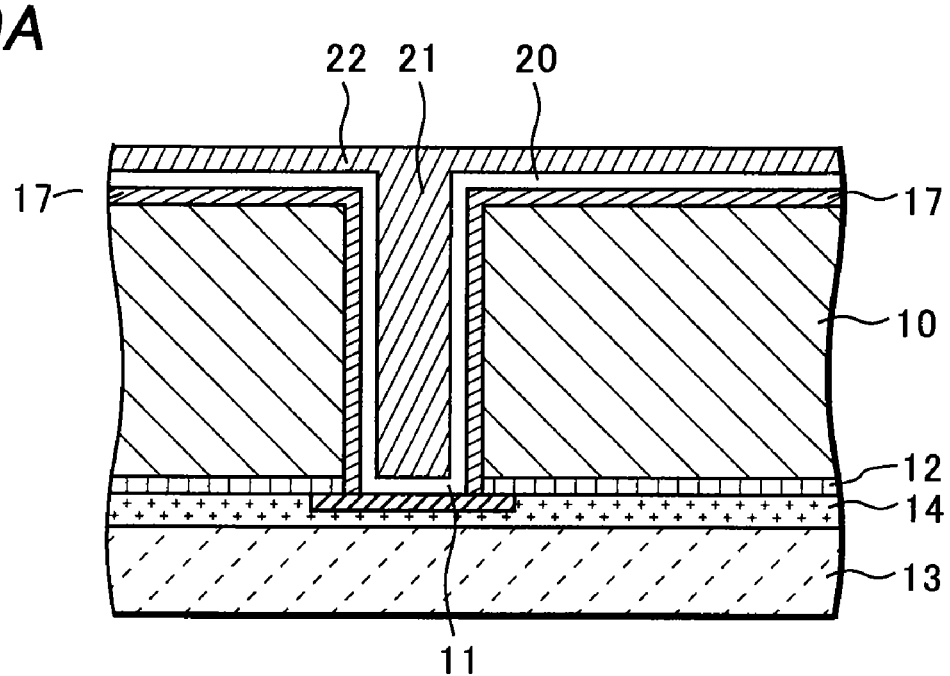
Figure 9B:
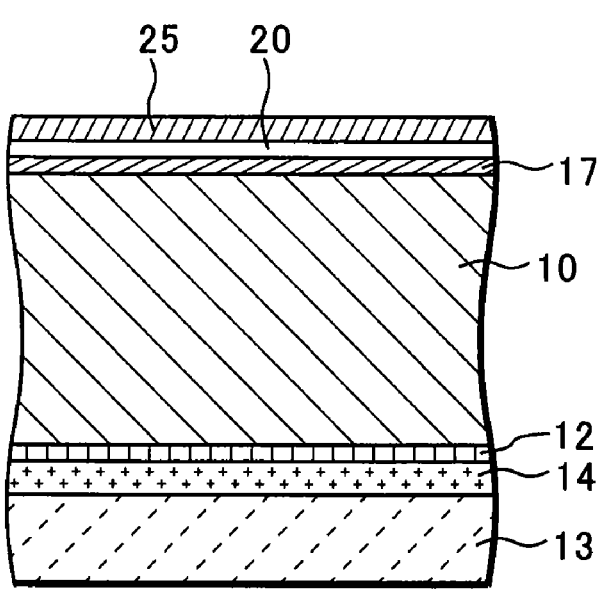

Next, as shown in FIGS. 9A and 9B, a barrier seed layer 20 is formed on the insulation film 17 on the back surface of the semiconductor substrate 10 including in the via hole 16. The barrier seed layer 20 has a lamination structure of a barrier metal layer and a seed layer (not shown). The barrier metal layer is formed of metal such as a titanium tungsten (TiW), titanium nitride (TiN) or tantalum nitride (TaN). The seed layer is to be an electrode for forming a wiring layer 22 by plating, which will be described below, and formed of metal such as copper (Cu). The barrier seed layer 20 is formed by, for example, a sputtering method, a CVD method, an electroless plating method, or the other deposition method. In a case that the insulation film 17 on the sidewall of the via hole 16 is formed of a silicon nitride film (SiN film), the barrier seed layer 20 can have a single layer structure formed of a seed layer of copper (Cu) only since the silicon nitride film (SiN film) functions as a barrier against copper diffusion.

Next, the penetrating electrode 21 formed of copper (Cu) and the wiring layer 22 connected with this penetrating electrode 21 are formed on the barrier seed layer 20 including in the via hole 16, by, for example, an electrolytic plating method. Plating thickness is adjusted to the one that the penetrating electrode 21 can be embedded in the via hole 16 completely or partially. The penetrating electrode 21 and the wiring layer 22 are electrically connected with the pad electrode 11 exposed at the bottom of the via hole 16 through the barrier seed layer 20. By this electrolytic plating, a copper layer 25 connected with the wiring layer 22 is formed on the barrier seed layer 20 in the corner portion of the semiconductor device, as shown in FIG. 9B.

Figure 10A:
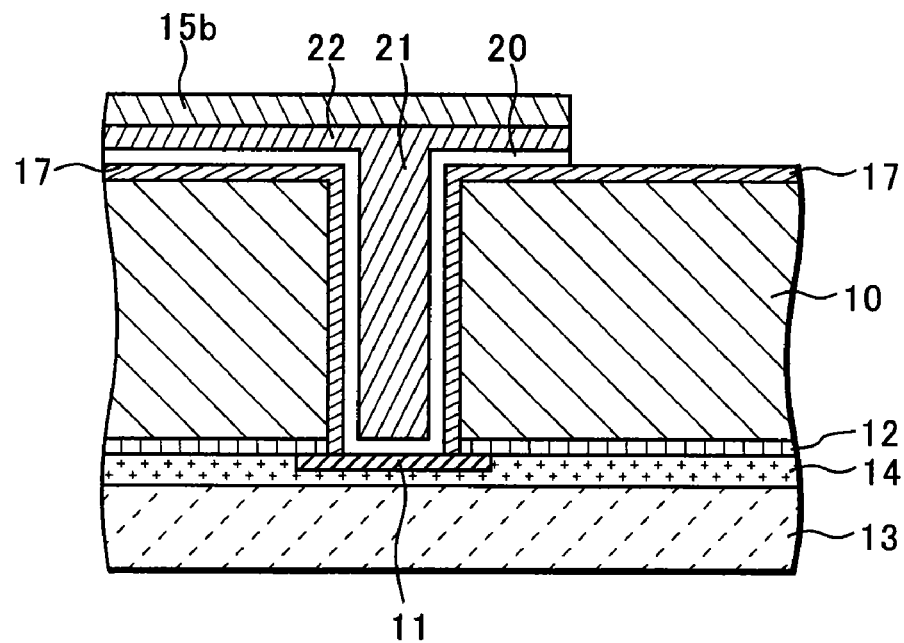
Figure 10B:
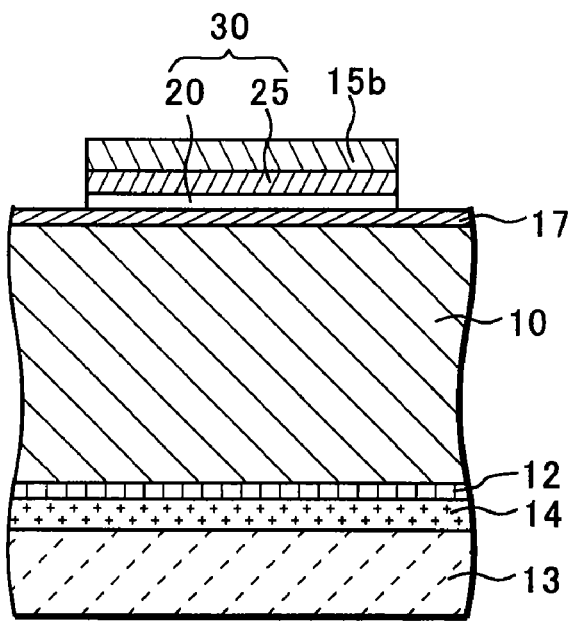

Next, as shown in FIGS. 10A and 10B, a third resist layer 15b for patterning the wiring layer 22 and the copper layer 25 into a predetermined pattern is selectively formed on the wiring layer 22 and the copper layer 25 on the back surface of the semiconductor substrate 10. The third resist layer 15b is formed on the wiring layer 22 and the copper layer 25 in a region to be left corresponding to the predetermined pattern. The region to be left of the wiring layer 22 includes a region formed with the via hole 16 and a region to be formed with the peeling prevention layer 30, at least.

Next, using the third resist layer 15b as a mask, an unnecessary portion of the wiring layer 22, the copper layer 25, and the barrier seed layer 20 is etched and removed. By this etching, the wiring layer 22 is patterned into a predetermined wiring pattern. On the other hand, in FIG. 10B, the peeling prevention layer 30 formed of the copper layer 25 and the barrier seed layer 20 is formed by this etching.

Figure 11B:
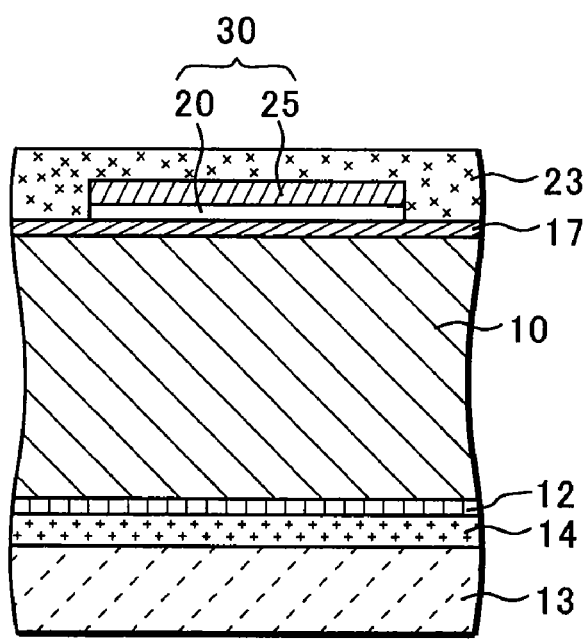

Next, as shown in FIGS. 11A and 11B, after the second resist layer 15b is removed, the protection layer 23 formed of a resist material such as a solder resist is formed on the back surface of the semiconductor substrate 10 so as to cover the substrate 10. An opening is provided in the protection layer 23 in a position corresponding to the wiring layer 22. Then, the ball-shaped conductive terminal 24 formed of metal such as solder is formed on the wiring layer 22 exposed at the opening by a screen printing method.

By the processes described above, the semiconductor device 100 having the peeling prevention layers 30 in its corner portions and formed of the semiconductor die 10 and the layers laminated thereon is completed. Since these processes are performed to a wafer, a large number of semiconductor devices 100 are formed on a sheet of wafer at a time. Therefore, by performing dicing along dicing lines as boundaries of these semiconductor devices 100, the wafer is cut and separated into individual semiconductor devices 100 as shown in FIG. 1.

Figure 12:
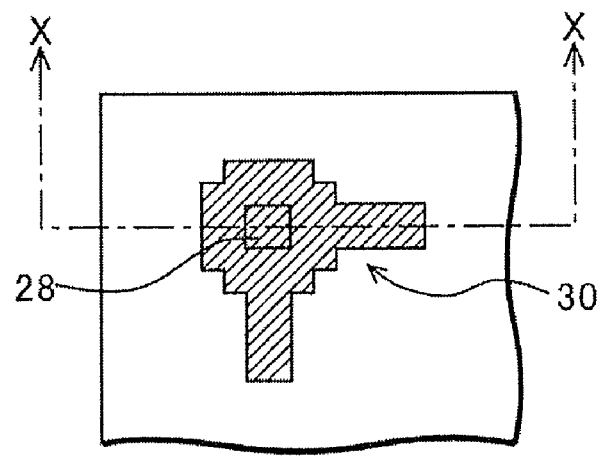
FIGS. 12 and 17 are enlarged plan views of a corner portion of a semiconductor device of a second embodiment of the invention.
Figure 13:
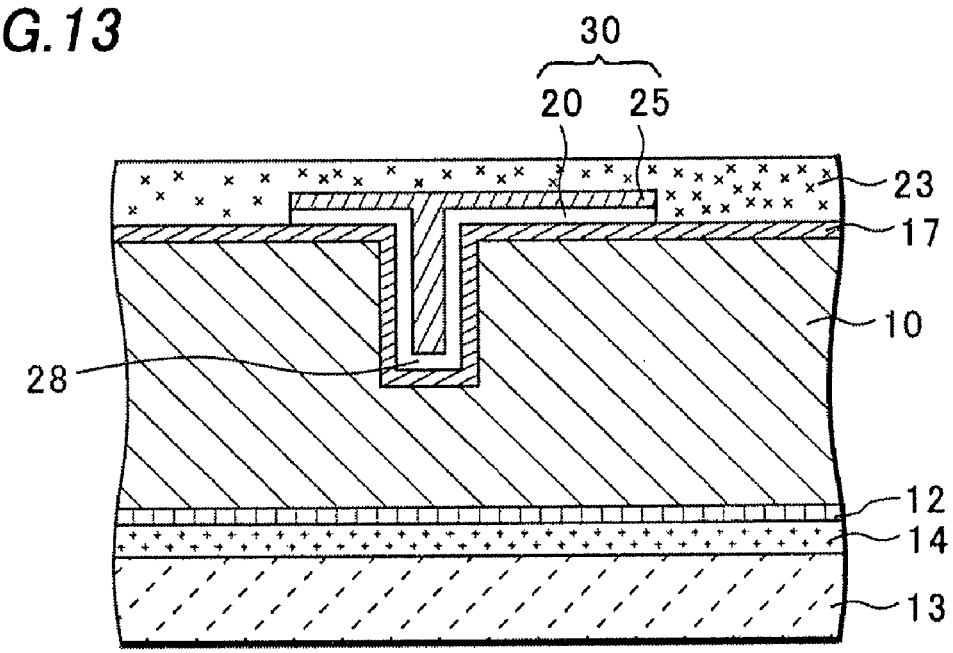
FIG. 13 is a cross-sectional view along line X-X of FIG. 12.

Next, a second embodiment of the invention will be described with reference to drawings. FIG. 12 is an enlarged plan view of a corner portion of the semiconductor device 100, and FIG. 13 is a cross-sectional view along line X-X of FIG. 12. This embodiment differs from the first embodiment in that a groove or hole portion 28 is formed on the back surface of the semiconductor substrate 100 and a part of the insulation film 17 and a part of the peeling prevention layer 30 are formed in this groove or hole portion 28. This particularly makes the insulation film 17 and the semiconductor substrate 10 strongly adhere to each other by an anchor effect of the groove or hole portion 28, increasing the peeling prevention effect.

Figure 14A:
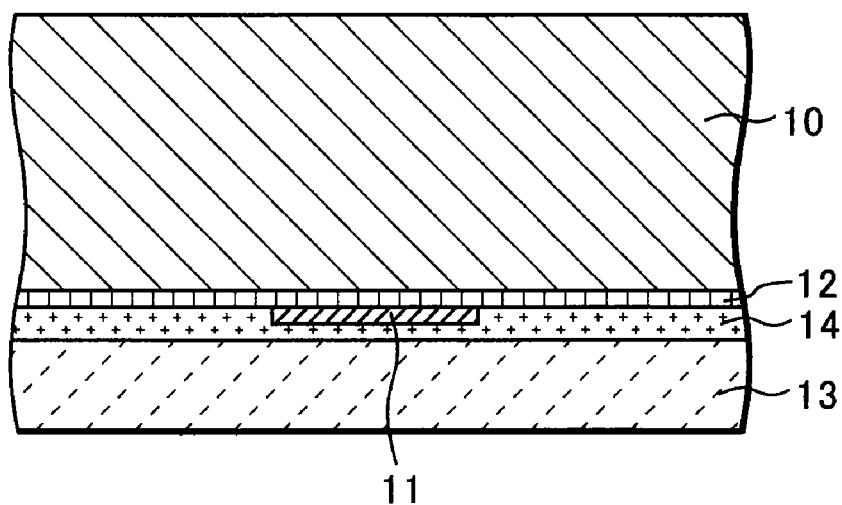
FIGS. 14A to 16B are cross-sectional views showing a semiconductor device manufacturing method of the second embodiment of the invention.

A manufacturing method of the semiconductor device of this embodiment will be described with reference to FIGS. 14A to 16B. FIGS. 14A, 15A, and 16A are cross-sectional views along line Y-Y of FIG. 1, and FIGS. 14B, 15B and 16B are cross-sectional views along line X-X of FIG. 12.

Figure 14B:
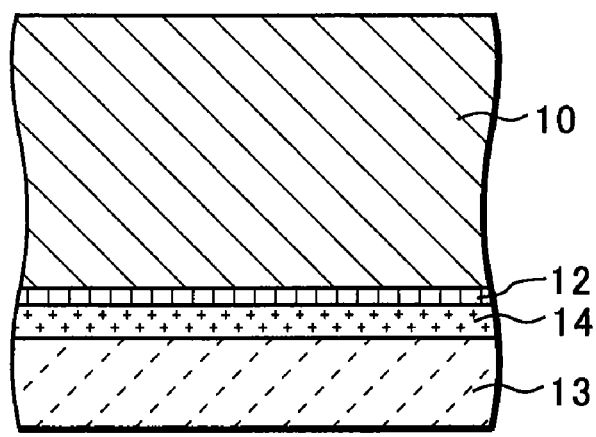
Figure 15A:
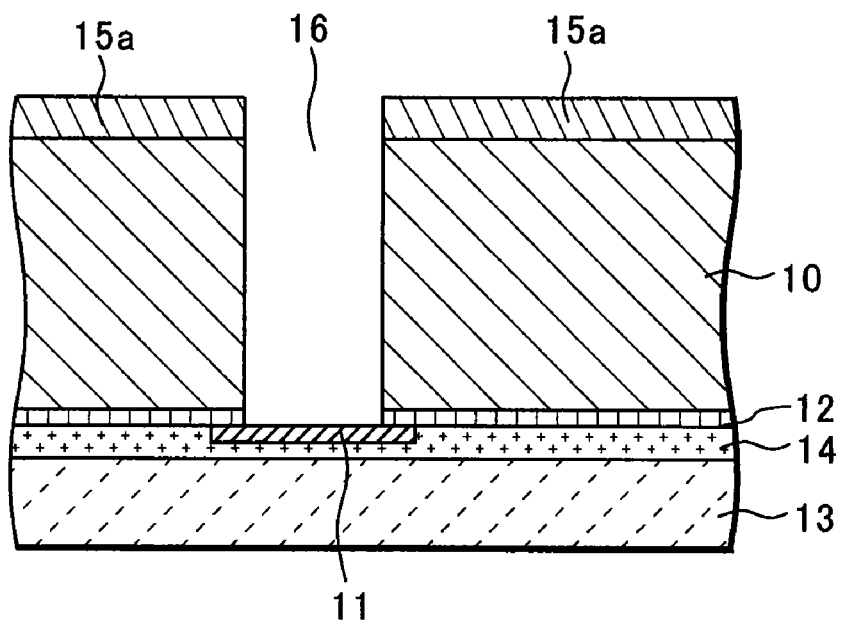

First, as shown in FIGS. 14A and 14B, in the similar manner to the first embodiment, a semiconductor substrate 10 formed with electronic devices (not shown) is prepared. A pad electrode 11 as an external connection electrode connected with the electronic device is formed on a front surface of the semiconductor substrate 10. The pad electrode 11 is formed on the front surface of the semiconductor substrate 10 with an interlayer insulation film 12 as a first insulation film therebetween. A support body 13 may be attached to the front surface of the semiconductor substrate 10.

Figure 15B:
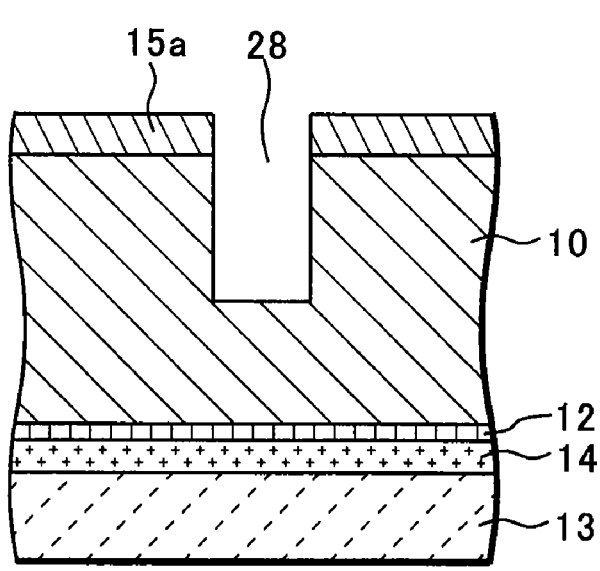
Figure 16A:
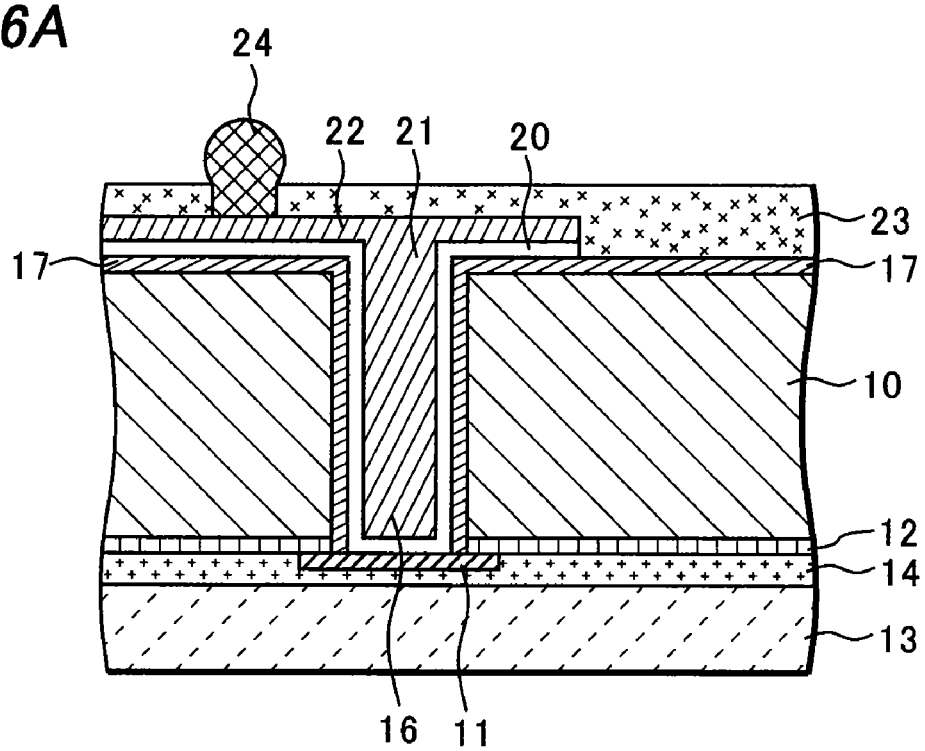

Next, as shown in FIGS. 15A and 15B, a first resist layer 15a is selectively formed on a back surface of the semiconductor substrate 10. That is, the first resist layer 15a has a first opening in a region corresponding to the pad electrode 11, and a second opening in a region to be formed with a peeling prevention layer 30. The second opening is formed smaller than the first opening. For example, when the first opening is about several tens of μm or larger, the second opening is about 5 μm.

Figure 16B:
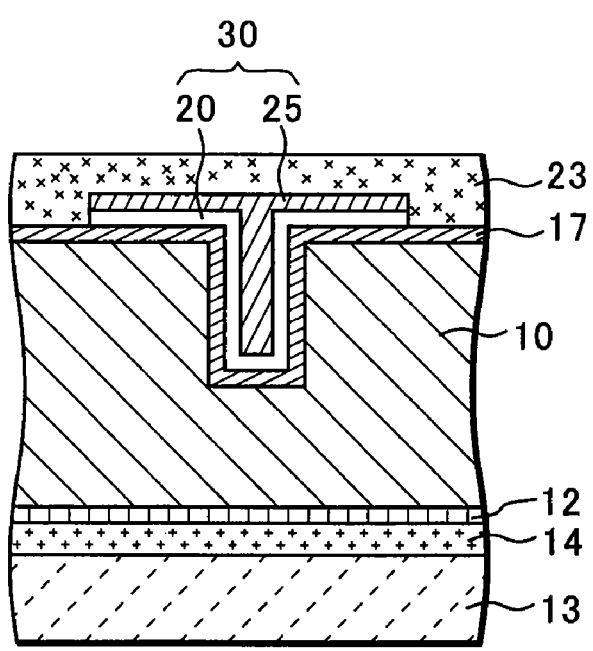

Next, the semiconductor substrate 10 is etched by a dry etching method using this first resist layer 15a as a mask. $CHF_3$, or the like can be used as etching gas. By this etching, a via hole 16 penetrating the semiconductor substrate 10 in a region corresponding to the pad electrode 11, and the groove or hole portion 28 not penetrating the semiconductor substrate 10 are formed. This is because the groove or hole portion 28 does not completely penetrate the semiconductor substrate 10 when the via hole 16 is formed, since etching gas does not easily enter the second opening due to its smaller diameter. When thickness of the semiconductor substrate 10 is 130 μm, depth of the groove or hole portion 28 is about 50 μm. Then, by performing the same process as in the first embodiment, as shown in FIGS. 16A and 16B, the semiconductor device having the peeling prevention layer 30 partially embedded in the groove or hole portion 28 can be obtained.

Figure 17:
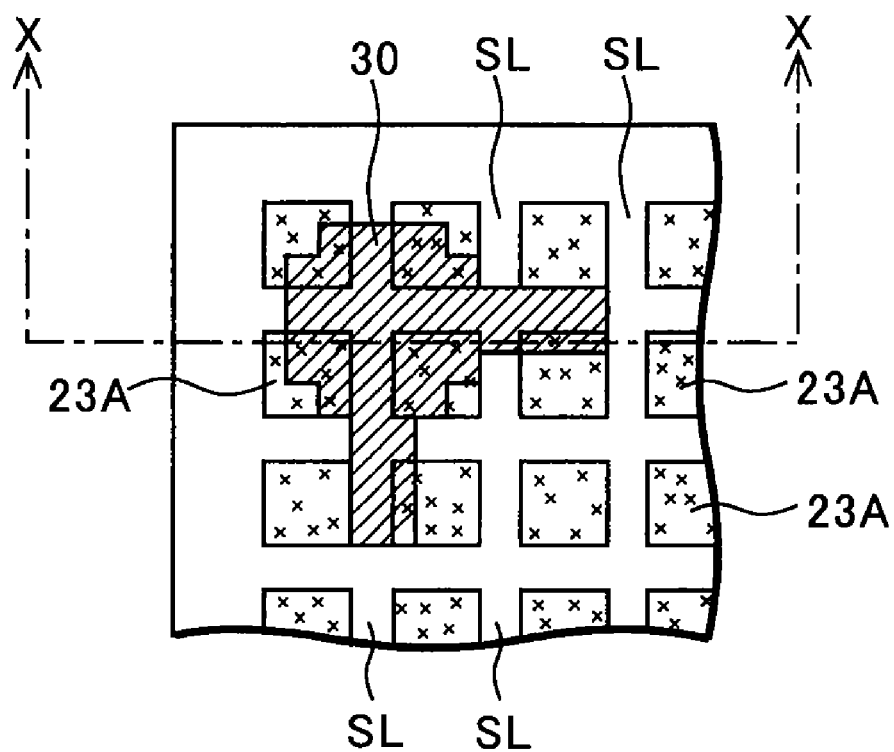
Figure 18A:
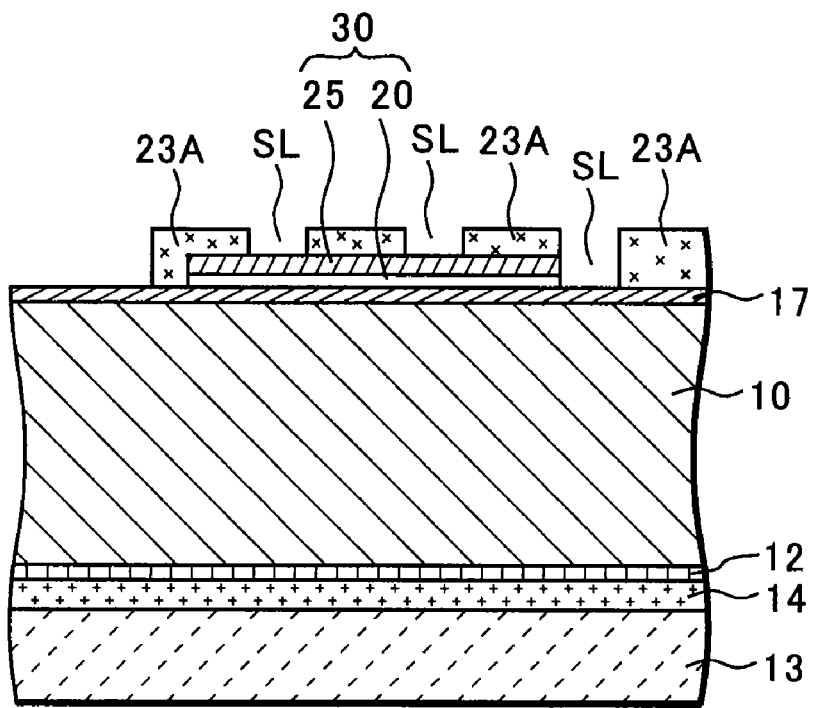
FIGS. 18A and 18B are cross-sectional views along line X-X of FIG. 17.

Next, a third embodiment of the invention will be described with reference to drawings. FIG. 17 is an enlarged plan view of a corner portion of the semiconductor device 100, and FIG. 18A is a cross-sectional view along line X-X of FIG. 17. This embodiment differs from the first embodiment in that the protection layer 23 is divided into a plurality of insular regions 23A by a plurality of slits SL. Such insular regions 23A work effectively particularly in the corner portions of the semiconductor device 100, but it is possible that the insular regions 23A are formed over the whole surface of the semiconductor device 100. By dividing the protection layer 23 formed of a solder resist or the like into the plurality of insular regions 23A in this manner, thermal stresses are reduced so as to prevent the protection film 23 and the insulation film 17 from peeling. The process of dividing the protection layer 23 into the plurality of insular regions 23A can be performed at the same time as the process of forming the opening for forming the ball-shaped conductive terminal 24 in the protection layer 23.

Figure 18B:
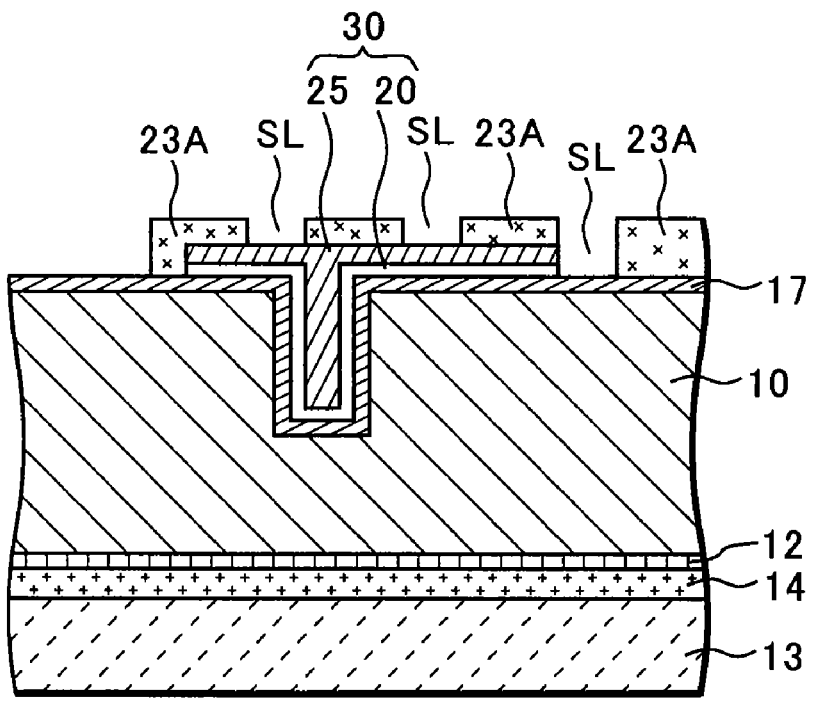

The feature of the structure of this embodiment can be applied to the second embodiment. That is, as shown in FIG. 18B, the groove or hole portion 28 is formed on the back surface of the semiconductor substrate 100, and a part of the insulation film 17 and a part of the peeling prevention layer 30 are formed in this groove or hole portion 28. Then, the insular regions 23A are formed in the corner portions of the semiconductor device 100 or over the whole surface of the semiconductor device 100.

Furthermore, it is also possible to provide the slits SL to the protection layer 23 without forming the peeling prevention layer 30.

What is claimed is:

1. A method of manufacturing a semiconductor device, comprising:
    providing a semiconductor substrate comprising a first insulation film formed on a front surface of the semiconductor substrate and a pad electrode formed on the first insulation film;
    forming from a back surface of the semiconductor substrate a via hole to penetrate the semiconductor substrate in a position of the semiconductor substrate corresponding to the pad electrode;
    forming a second insulation film to cover a sidewall of the via hole and the back surface;
    etching the second insulation film so as to expose at least part of the pad electrode;
    forming a metal layer in the via hole so as to be in contact with the exposed pad electrode and on the back surface covered by the second insulation film;
    patterning the metal layer to form a penetrating electrode disposed in the via hole and connected with the pad electrode and a peeling prevention layer disposed on the second insulation film so as to be electrically isolated;
    forming a protection layer covering the penetrating electrode, the second insulation film and the peeling prevention layer; and
    cutting the semiconductor substrate covered by the protection layer so as to produce a semiconductor device comprising the penetrating electrode and the peeling prevention layer,
    wherein the peeling prevention layer is not electrically connected to any device element formed on the front or back surface of the semiconductor substrate after the cutting of the semiconductor substrate.

2. The method of claim 1, wherein the metal layer is formed by an electrolytic plating method.

3. The method of claim 1, wherein the peeling prevention layer is formed in a corner portion of the semiconductor substrate.

4. The method of claim 1, further comprising forming a recess in the back surface when the via hole is formed, wherein part of the second insulation film and part of the peeling prevention layer are formed in the recess.

5. The method of claim 1, further comprising dividing the protection layer into a plurality of regions.

6. The method of claim 1, wherein the forming of the metal layer comprises forming a copper layer.

* * * * *